United States Patent
Nguyen et al.

(10) Patent No.: US 6,515,839 B1
(45) Date of Patent: *Feb. 4, 2003

(54) ELECTRONIC DISCHARGE PROTECTION SYSTEM FOR MIXED VOLTAGE APPLICATION SPECIFIC CIRCUIT DESIGN

(76) Inventors: Hoang P. Nguyen, 3914 Century Dr., Fort Collins, CO (US) 80526; John D. Walker, 1631 N. Royer St., Colorado Springs, CO (US) 80907

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/828,246

(22) Filed: Mar. 31, 1997

Related U.S. Application Data

(63) Continuation of application No. 08/259,240, filed on Jun. 13, 1994, now Pat. No. 5,616,943, which is a continuation-in-part of application No. 08/129,224, filed on Sep. 29, 1993, now abandoned.

(51) Int. Cl.⁷ ................................................. H02H 3/20
(52) U.S. Cl. ........................................ 361/91.5; 361/111
(58) Field of Search ............................... 361/18, 56, 91, 361/111, 119, 91.1, 91.5

(56) References Cited

U.S. PATENT DOCUMENTS

| | | | |
|---|---|---|---|
| 4,870,530 A | * 9/1989 | Hurst et al. ............ | 361/56 |
| 4,989,057 A | 1/1991 | Lu ......................... | 357/23.7 |
| 4,990,976 A | 2/1991 | Hattori .................. | 357/23.4 |
| 5,060,037 A | 10/1991 | Rountree ................ | 357/23.13 |
| 5,077,591 A | 12/1991 | Chen et al. ............ | 357/23.13 |
| 5,087,955 A | 2/1992 | Futami ................... | 357/41 |
| 5,159,518 A | 10/1992 | Roy ........................ | 361/56 |
| 5,196,981 A | * 3/1993 | Kuo ........................ | 361/56 |
| 5,208,719 A | 5/1993 | Wei ........................ | 361/56 |
| 5,272,097 A | 12/1993 | Shiota .................... | 437/34 |
| 5,274,262 A | 12/1993 | Avery ..................... | 257/362 |
| 5,287,241 A | 2/1994 | Puar ....................... | 361/56 |
| 5,290,724 A | 3/1994 | Leach ..................... | 437/51 |
| 5,293,063 A | 3/1994 | Anceau ................... | 257/653 |
| 5,442,217 A | 8/1995 | Mimoto .................. | 257/361 |
| 5,561,577 A | * 10/1996 | Motley .................... | 361/56 |
| 5,717,559 A | * 2/1998 | Narita ..................... | 361/56 |

OTHER PUBLICATIONS

Charvaka Duvvury Ajith Amerasekera, ESD: A Pervasive Reliability Concern for IC Technologies, Proceedings of the IEEE, vol. 81, No. 5, May 1993, pp. 690–702.

Ping Yang, Jue–Hsien Chern, Design for Reliability: The Major Challenge for VLSI, Proceedings of the IEEE, vol. 81, No. 5, May 1993, pp. 730–744.

Thomas M. Frederiksen, Standard Circuits in the New CMOS Era, Electrostatic Discharge Improvement, 1984, p. 129–130 No Month 1989.

* cited by examiner

*Primary Examiner*—Ronald W. Leja
(74) *Attorney, Agent, or Firm*—Townsend and Townsend and Crew LLP

(57) ABSTRACT

An ESD protection system that makes use of several different types of over-voltage protection devices provides ESD conduction paths between different power lines. For example, the system may employ shunt diodes between the ground lines of the different power supplies and between IC pads and power supply lines; SCR protection between IC pads and ground; and thick field device protection between different power supply $V_{DD}$ lines. In this way, a conduction path for an ESD event between two circuit elements may be implemented using the device whose switching characteristics are best suited to that application.

8 Claims, 14 Drawing Sheets

ELECTRONIC DISCHARGE PROTECTION SYSTEM FOR MIXED VOLTAGE APPLICATION SPECIFIC CIRCUIT DESIGN

This is a continuation of U.S. patent application Ser. No. 08/259,240 filed Jun. 13, 1994, which issued as U.S. Pat. No. 5,616,943 on Apr. 1, 1997 entitled "Electrostatic Discharge Protection System for Mixed Voltage Application Specific Integrated Circuit Design", which is a continuation-in-part of U.S. patent application Ser. No. 08/129,224, filed Sep. 29, 1993, entitled "Field Implant for Silicon Controlled Rectifier", now abandoned.

BACKGROUND OF THE INVENTION

1. Field of the Invention

The present invention relates to integrated circuit semiconductor devices, and more specifically, to electrostatic discharge protection devices used in such circuits.

2. Description of the Related Art

Electrostatic discharge (ESD) phenomena commonly result from pulses of high voltage (typically, several kilovolts), moderate current (a few amperes) and short duration (on the order of 100 nanoseconds) generated by a variety of sources such as human bodies, electric fields generated by machinery, and the like. Several analytical models have been developed to approximate these phenomena, including: 1) the Human Body Model (described in more detail in MIL-STD 883C method 3015.7, hereby incorporated by reference), which is typical of ESD resulting from the movement of a human body during, e.g., handling of the device; 2) the Machine Model, which characterizes ESD resulting from charges developed in automated assembly areas; and 3) the Charged Device Model, which approximates ESD from manufacturing and handling devices.

ESD effects are a common problem in integrated circuit (IC) electronics and are particularly troublesome in complimentary metal oxide semiconductor (CMOS) devices which have particularly thin gate oxides and very short channel devices. Such structures typically can withstand only a few tens of volts. An ESD pulse conducted through a CMOS IC can induce oxide rupture and device or interconnect burnout, and have potentially disastrous consequences. An ESD pulse can also induce a "latch-up" condition in thick field devices.

ESD problems can be minimized by including appropriate anti-static protection on the circuit boards on which the ICs are installed; however, the ICs still are susceptible to ESD before and during the circuit board fabrication process. A general personnel awareness of ESD problems and counter-measures such as electrically grounded bracelets and the like can abate somewhat risks in this phase of the IC life span; however, it is at best a partial solution. Therefore, it is desirable to include ESD protection circuitry within the IC itself.

One prior art ESD protection circuit involves the use of a resistor interposed between an IC chip bonding pad or terminal and internal IC circuitry. By dropping a portion of the input signal across the resistor, much of the ESD voltage can be dissipated and the CMOS latch-up current can be reduced as well. Unfortunately, the combination of the input resistor and the parasitic capacitance of the bonding pad and input line together generate a significant RC time delay which limits the speed at which the IC operates. Another prior art solution has been to use diodes to shunt the ESD current to ground. This approach has its drawbacks, however, since such diodes typically have a significant parasitic series resistance which limits the amount of current that may be shunted. Furthermore, the forward current increases with temperature due to the increased saturation current and due to the reduced semiconductor band gap. Thus, heating that results from an ESD event further limits current carrying capability. Large area diodes may be used to reduce this resistance; however, this variation reduces the chip density and increases the input circuit's capacitance.

Although the above approaches have proven to be workable, they all operate under the assumption that the circuit being protected is of a single voltage design; that is, all sections of the circuit share a common $V_{DD}$. In contrast to single voltage designs, many circuit types make use of a mixed voltage supply scheme, where different sections of the circuit use different operating voltages. An example of this type of circuit is the application specific integrated circuit (ASIC), which may use isolated power and ground busses for I/O and core circuitry, or separate busses for analog and digital circuitry. In ASIC designs which use different power supplies for, e.g., I/O circuitry and core logic, a large amount of power dissipated during an ESD event will cause a small logic area to fail. Conversely, if the logic area is large and the I/O area relatively small, an ESD event may destroy the I/O area instead.

SUMMARY OF THE INVENTION

It is an object of this invention to provide an ESD protection system that is operable in a mixed-voltage circuit.

It is a further object of this invention to provide an ESD protection system that is operable in systems having multiple, isolated power supplies.

The above objects are achieved by providing an ESD protection system that makes use of several different types of over-voltage protection devices to provide ESD conduction paths between different power lines. For example, the invention may employ shunt diodes between the ground lines of the different power supplies and between IC pads and power supply lines; SCR protection between IC pads and ground; and thick field device protection between different power supply $V_{DD}$ lines. In this way, a conduction path for an ESD event between two circuit elements may be implemented using the device whose switching characteristics are best suited to that application.

BRIEF DESCRIPTION OF THE DRAWINGS

These and other objects and advantages of this invention will become apparent and more readily appreciated from the following description of the presently preferred exemplary embodiments, taken in conjunction with the accompanying drawings, of which.

DETAILED DESCRIPTION OF THE PRESENTLY PREFERRED EXEMPLARY EMBODIMENTS

The present invention will be discussed hereinafter with particular reference to application specific integrated circuits (ASICs); however, it should be understood that the invention is in no way limited to such an environment and may in fact be utilized in any circuit environment in which ESD protection is appropriate and in which fabrication technologies permit.

As noted above, ASICs often use separate power supplies for I/O circuitry and core logic circuitry, or separate power supplies for digital circuitry and analog circuitry. Additionally, an ASIC may use a relatively high voltage power supply for powering components designed to operate at high speed, and a relatively low power supply for powering components designed to operate at a relatively low speed. In the ensuing discussion, the following table of abbreviations will denote these voltages:

| | |
|---|---|
| VDDIO5 | 5V $V_{DD}$ for peripheral I/O circuitry; |
| VDDIO3 | 3.3V $V_{DD}$ low power for peripheral I/O circuitry; |
| VDDCORE5 | 5V $V_{DD}$ for core logic circuitry; |
| VDDCORE3 | 3.3V $V_{DD}$ low power for core logic circuitry; |
| VDDA | $V_{DD}$ for analog circuitry; |
| VSSIO | I/O circuitry ground; |
| VSSCORE | Core logic circuitry ground; |
| VSSA | Analog circuitry ground; |

Figure 1:
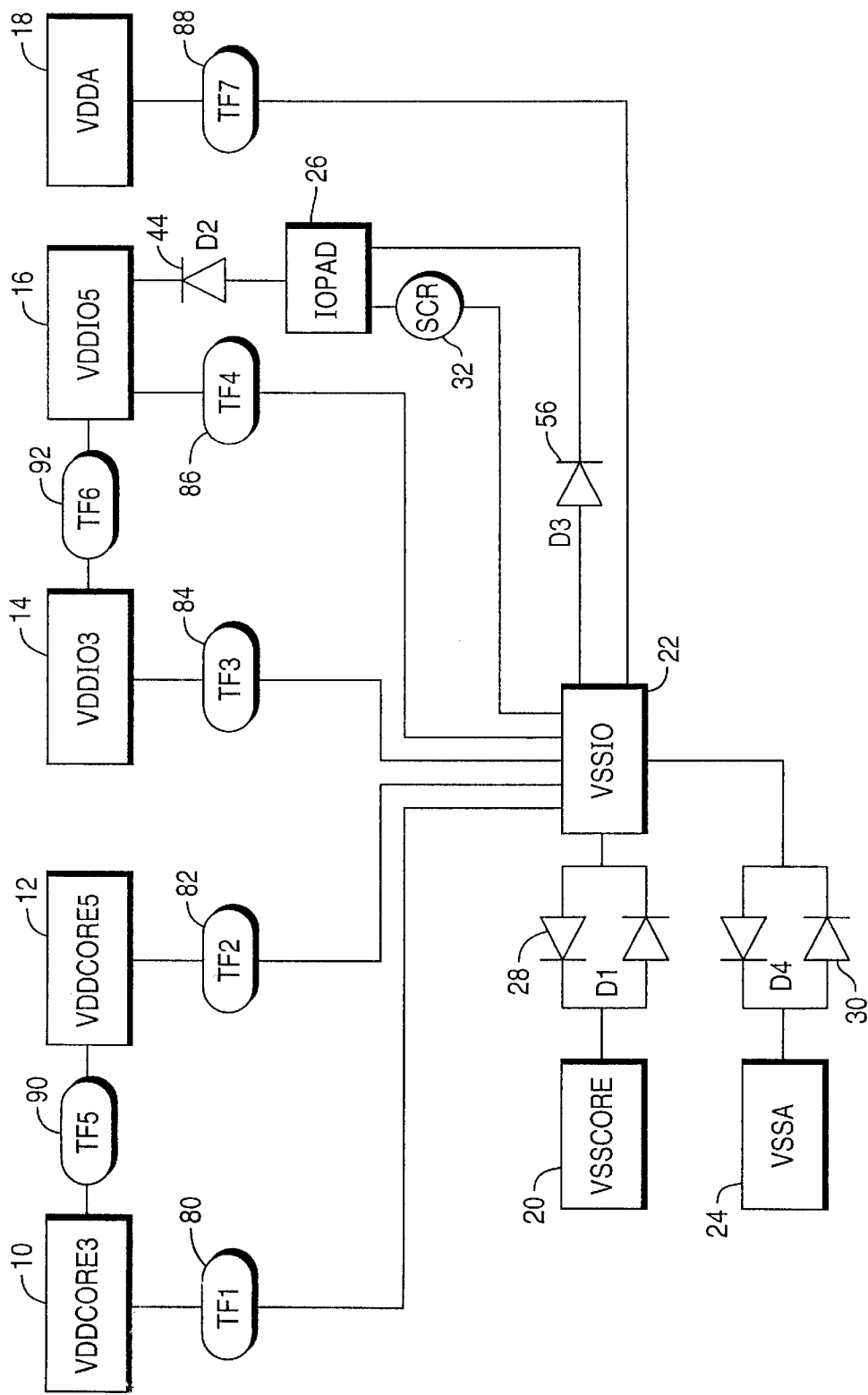
FIG. 1 is a block diagram of a preferred embodiment of an ESD protection system according to the present invention.

FIG. 1 is a block diagram of an exemplary mixed-voltage IC architecture with ESD protection according to the present invention. As seen in FIG. 1, the IC has a VDDCORE3 +3.3V low power core logic circuitry pad 10, a VDDCORE5 +5V core logic circuitry pad 12, a VDDIO3 +3.3V low power peripheral I/O circuitry pad 14, a VDDIO5 +5V peripheral I/O pad 16, a VDDA $V_{DD}$ analog circuitry pad 18, a VSSCORE core circuitry ground pad 20, a VSSIO I/O circuitry ground pad 22, and a VSSA analog circuitry ground pad 24. The IC also has a plurality of pads IOPAD 26 for connection of various IC components to external elements. Only one such pad 26 has been shown in the Figure for simplicity and clarity.

A number of thick field devices 80, 82, 84, 86, and 88 are interposed between the various $V_{DD}$ pads and VSSIO 22 and between the $V_{DD}$ pads themselves. A thick field device 90 is interposed between 3 and 5 volt core $V_{DD}$ pads 10, 12. A thick field device 92 is also interposed between 3 and 5 volt IO $V_{DD}$ pads.

Diode assembly 28 between the VSSIO I/O ground pad 22 and the VSSCORE core logic ground pad 20 provides a conduction path for ESD events travelling between IOPAD 26 and the VSSCORE pad 20. When an ESD event originates at the IOPAD 26 and propagates toward VSSCORE pad 20, it flows through the SCR 32 and the VSSIO I/O ground pad 22 to VSSCORE pad 20.

Diode assembly 30 interposed between VSSIO pad 22 and VSSA pad 24 is virtually identical in structure to diode assembly 28. Diode assembly 30 provides a conduction path for ESD events passing between IOPAD 26 and VSSA pad 24.

A single diode path 44 is positioned between IOPAD 26 and VDDIO5 pad 16. Another diode path 56 is positioned between IOPAD 26 and VSSIO 22. An SCR 32 locate on the exterior side of the IP pad provides ESD protection to VSSIO 22.

Figure 2:
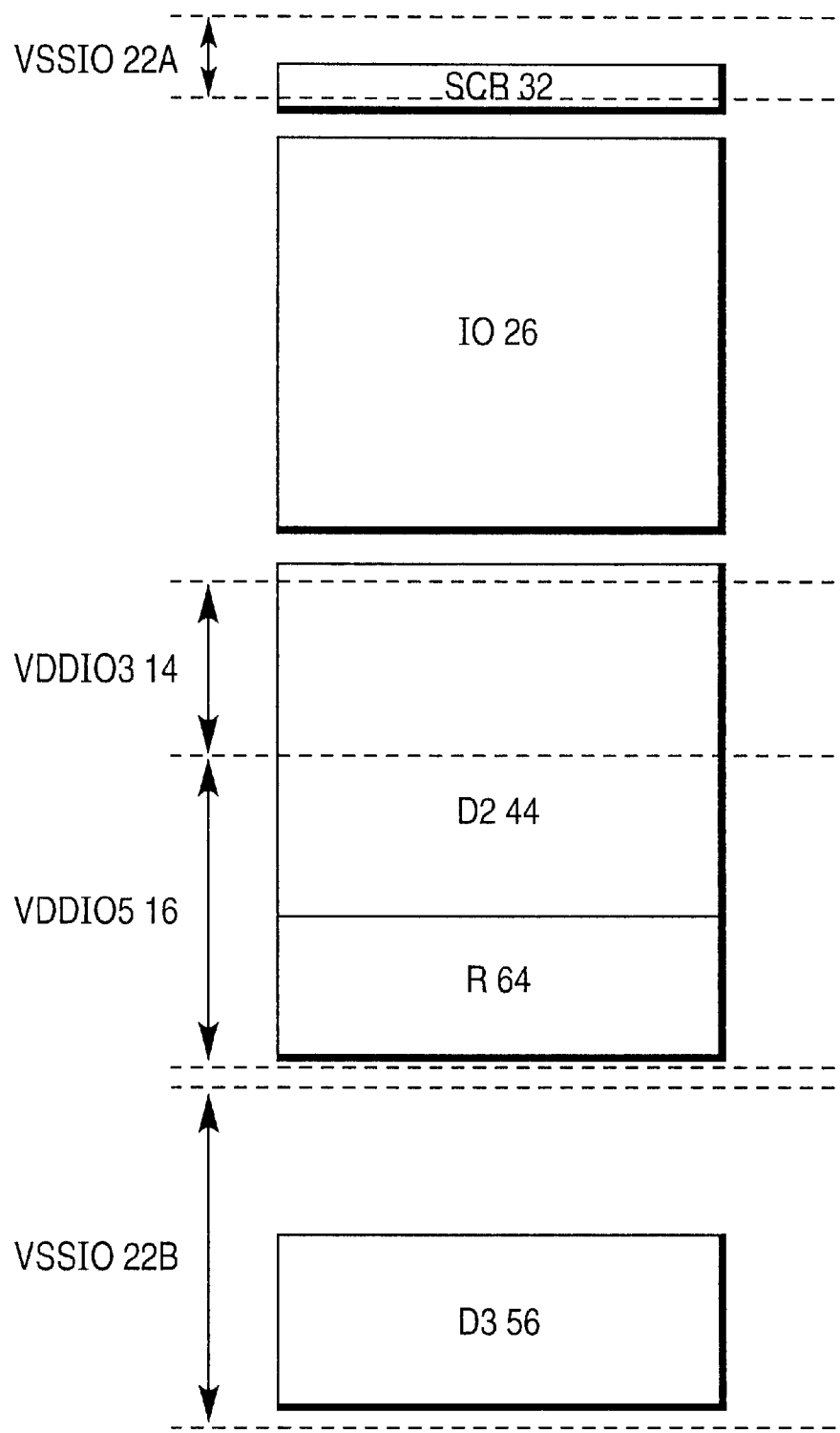
FIG. 2 shows a layout in the vicinity of an IO pad of the system architecture shown in FIG. 1.

FIG. 2 shows a radial slice from a chip in the vicinity of an IO pad. A VSSIO chip ring 22A is a metal trace which extends around the outer circumference of the chip. One IO pad 26 is shown. An SCR 32 locate on the exterior side of the IO pad provides ESD protection to VSSIO ring 22A. The SCR extends the full width of the IO pad. On the interior side of the IO pad are metal rings for other voltage supply signal lines. In order, they include: VDDIO3 14, VDDIO5 16, VSSIO 22B, VSSCORE (not shown), VDD CORE5 (not shown), and VDDCORE3 (not shown).

ESD protection for the IO pad is located in the vicinity of the respective rings. A P-channel diode D2 44 is located under the VDDIO3 to connect the IO pad to VDDIO5. An N-channel diode D3 56 is located underneath or adjacent to a second VSIO ring 22B. A resistor 64 is located between the IO pad and N-channel diode 56.

Details of individual protection devices will be discussed in greater detail below.

Figure 3A:
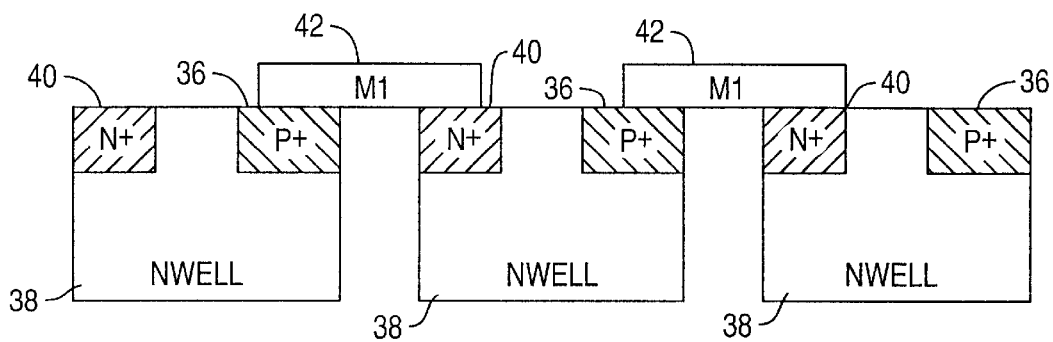
FIGS. 3A and 3B are a cross section and a schematic diagram of a shunt diode protection device as shown in FIG. 1.
Figure 3B:
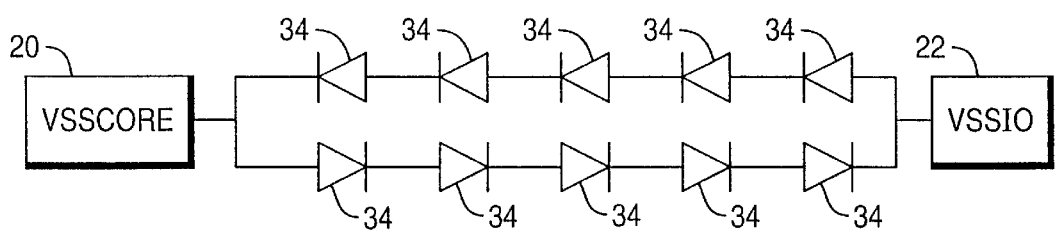

As shown in greater detail in the schematic diagram of FIG. 3B, each half of the diode assembly 28 includes a plurality (preferably at least three, more preferably five) of series-connected diodes 34.

As more clearly shown in the side view of FIG. 3A, each of the three diodes 34 is composed of a P+ active anode 36 and an N-well cathode 38. The diodes are connected in series, through a metal contact 42 which connects to a P+ anode 36 of one diode and an N+ region 40 in the N-well 38 of an adjacent diode. Adjacent diodes are connected in series by metal traces 42. Preferably, the spacing between the N+ connection 40 and the P+ anode 36 in each diode 34 is on the order of 1.0 $\mu$m, (e.g., 1.2 $\mu$m), and the overall width of each diode 34 is on the order of tens of $\mu$m (e.g., 60 $\mu$m). The diodes are fabricated to provide a trip point voltage $V_t$ of 0.5V at 25° C.

Figure 4A:
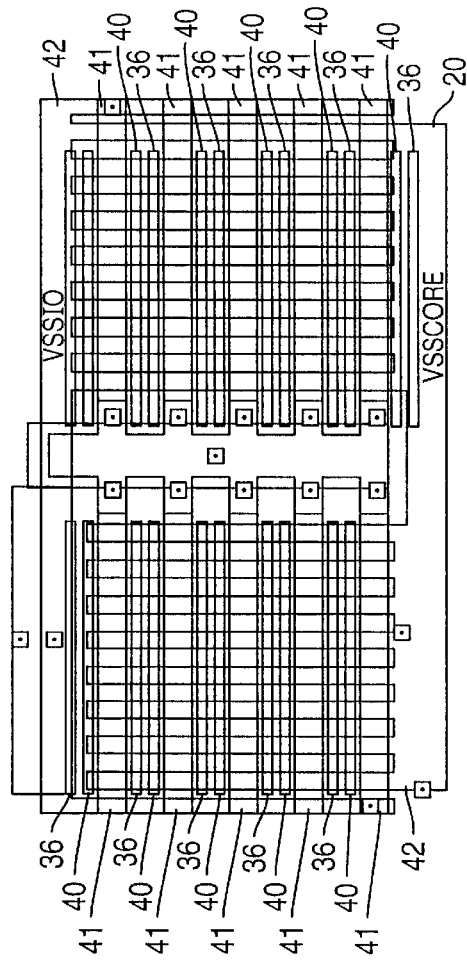
FIGS. 4B and 4A are top views of a single shunt and a series of shunt diodes, respectively.
Figure 4B:
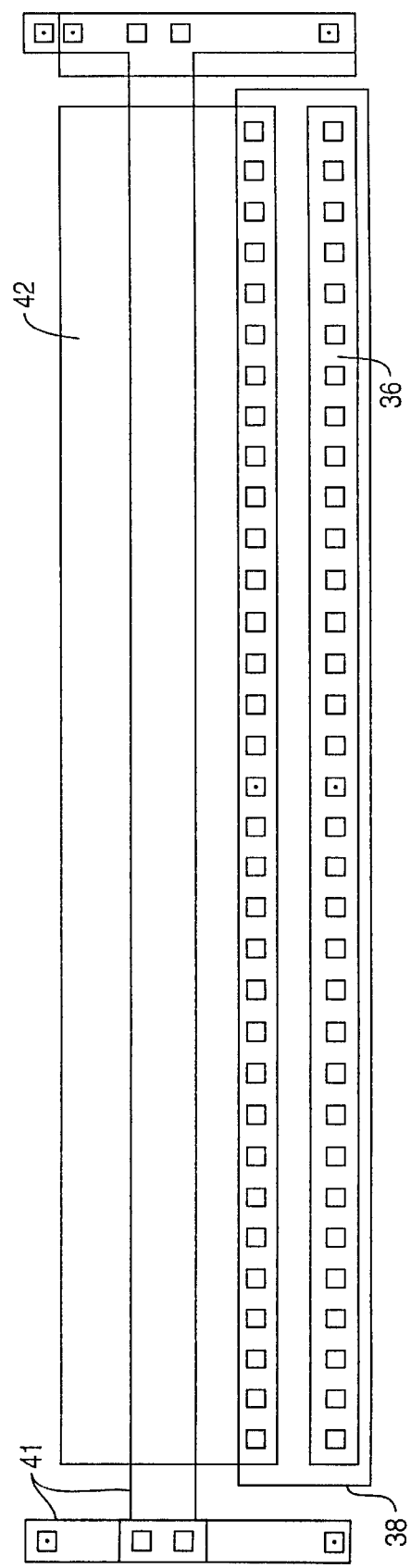

FIG. 4B is a top view of one of the diodes 34 in more detail. Each diode includes an N well 38 with a P+ active anode 36. Across the N well 38 from P+anode 36 is an N+ cathode 40. A metal layer 42 connects the N+ cathode 40 of the diode to a P+ anode of the next diode (not shown). Underneath the metal layer 42 is a substrate tie down connection 41.

FIG. 4A is a representative layout for ten diodes forming diode assembly 28. FIG. 4A shows a series of substrate ties 41, cathodes 40, and anodes 36. For clarity, the connecting metal layer 42 is shown as banded, but the metal can also be a continuous sheet.

It should be noted that the operation of the diodes 34 is fairly temperature-dependent, and the trip point voltage $V_t$ of these diodes may change from 0.5V at 25° C. to 0.3V at 90° C. For this reason, use of this structure between $V_{SS}$ busses such as VSSIO and VSSCORE is appropriate only when such variations are not an issue. For example, the diodes are used in the arrangement of FIG. 1 because isolation between $V_{SS}$ busses normally is done for noise isolation, and the series connection of at least three diodes 34 suppresses noise signals due to the combined sheet resistance of their N wells (about 1 k$\Omega$/□). This suppression can be done without regard to the temperature dependence of $V_t$. It is important, however, not to use too many series diodes 34 in the diode assembly 28, since their combined sheet resistances can be so great that activation of the diodes 34 during an ESD event is inhibited.

Diode assembly 30 interposed between VSSIO pad 22 and VSSA pad 24 is virtually identical in structure to diode assembly 28. Diode assembly 30 (FIG. 1) provides a conduction path for ESD events passing between IOPAD 26 and VSSA pad 24.

Figure 5B:
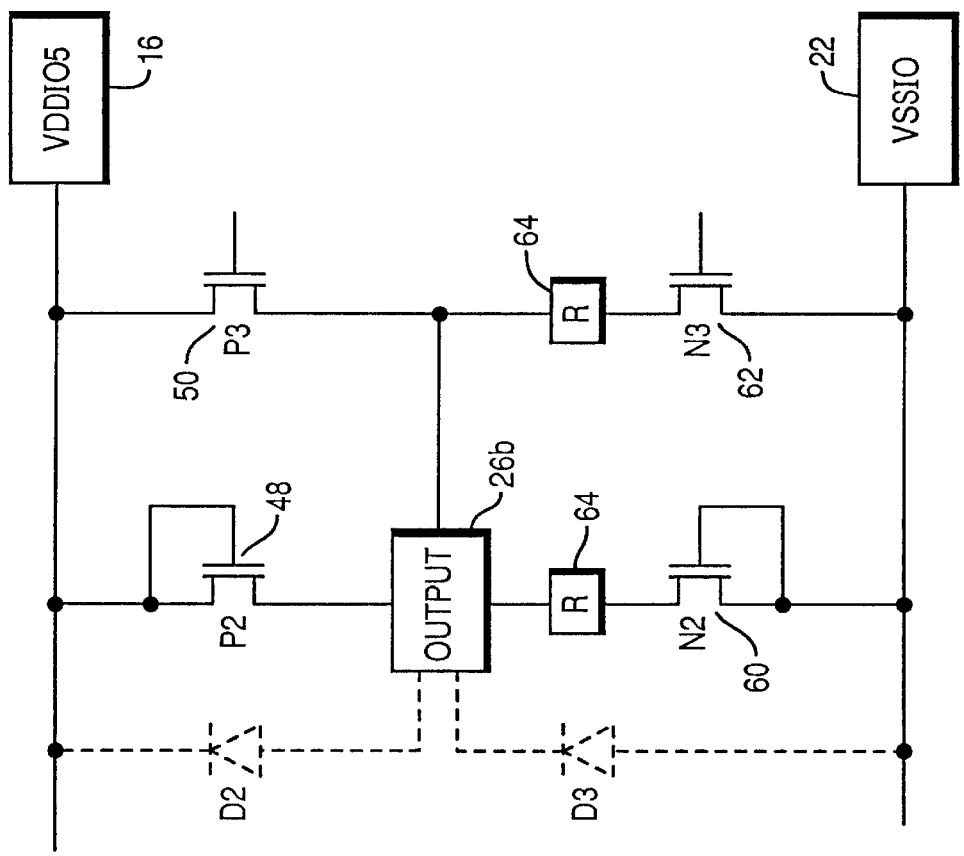
FIGS. 5A and 5B are schematic diagrams showing shunt diodes used in the preferred embodiment of the present invention.
Figure 5A:
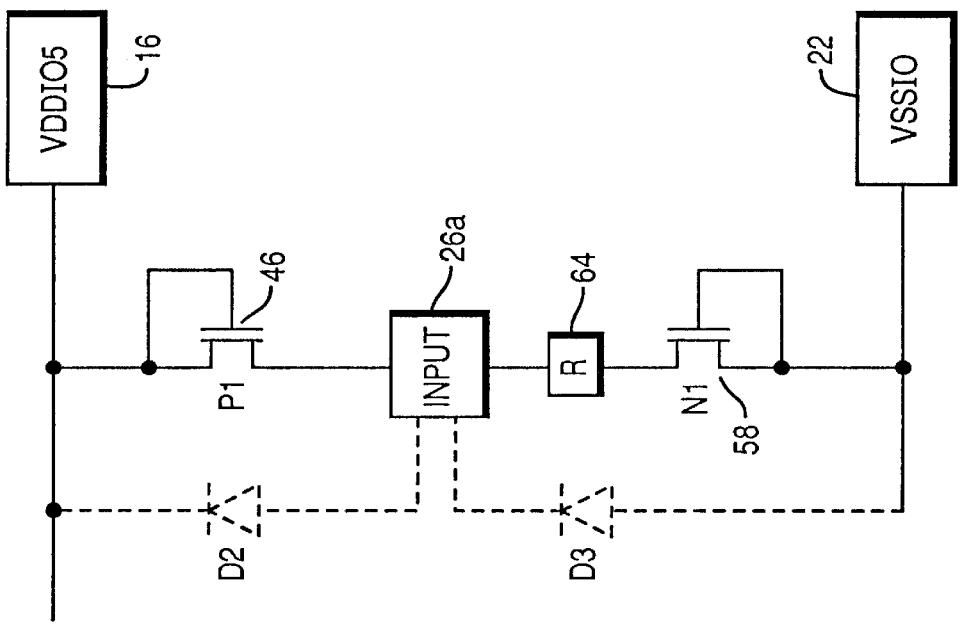

FIGS. 5A and 5B show details of the individual diodes D2, D3 of FIG. 1. Diodes D2, D3 may take either of two forms. When IOPAD 26 is an input pad 26a, the diode D2 is a parasitic diode formed by a P-channel MOS transistor 46 that has its gate tied to VDDIO5. When the IOPAD 26 is an output pad 26b, the diode D2 is a parasitic diode formed by the combination of a similar P-channel MOS transistor 48 and the pad's P-channel MOS transistor output driver 50. Each of these diodes turns on when a positive ESD pulse travels from IOPAD 26 to VDDIO5.

Diode D3 (FIG. 1) between IOPAD 26 and VSSIO pad 22 also may take either of two forms. When IOPAD 26 is an input pad 26a, the diode D3 is a parasitic diode formed by an N-channel MOS transistor 58 that has its gate tied to VSSIO as shown in FIG. 5. When the IOPAD 26 is an output pad 26b, the diode D3 is a parasitic diode formed by the combination of a similar N-channel MOS grounded gate transistor 60 and the pad's N-channel MOS transistor output driver 62. Each of these diodes turns on when a negative ESD pulse travels from IOPAD 26 to VSSIO.

Figure 7:
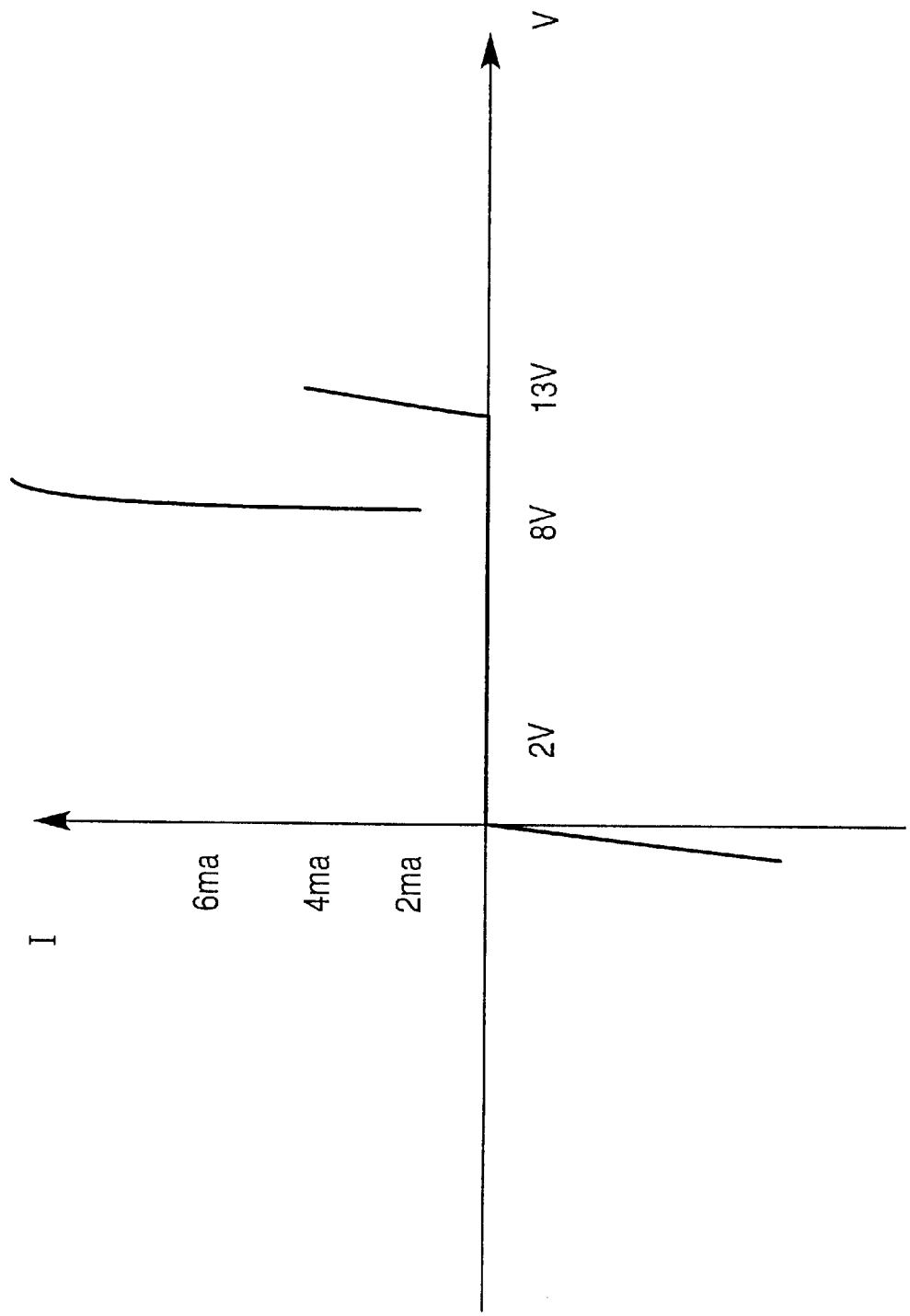
FIG. 7 is a graph of the VBDSS curve of an NMOS device shown in FIG. 8.

The operation of the N-channel grounded gate MOS transistors 60 and 62 (FIG. 5B) warrant further discussion. When the gate of a MOS transistor is tied to its source, its zero bias breakdown voltage is commonly referred to as $BV_{dss}$. Preferably, the N-channel MOS transistors 60 and 62 are built on a sub-micron process, and when the gates of these transistors are grounded, they turn on at about 13V. When this happens, the devices act as current paths for dissipation of an ESD pulse that is positive from IOPAD 26 to VSSIO 22. A graph showing the $BV_{dss}$ operation of the transistors 60 and 62 is shown in FIG. 7.

In older (i.e., larger scale) fabrication technologies, the gate oxide breakdown voltage was at least 20V, and these parameters were acceptable. The thinner gate oxides used in newer fabrication technologies, such as sub-micron processes, have breakdown voltages of only about 17–18V. A reverse bias breakdown of 16V no longer provides a desired operating tolerance.

For this reason, an SCR 32 (FIG. 1) is placed in parallel with the diode 56. SCR 32 turns on during an ESD event, thereby protecting the diode 56. Even so, the diode 56 may fail at the beginning of an ESD event even before the SCR 32 turns on. To eliminate this possibility, a 20$\Omega$ poly resistor 64 (FIG. 5B) is added to the gate fingers of each of the N-channel MOS transistors 60 and 62 to limit the current that reaches them before activation of the SCR 32. Consequently, it is necessary to increase the width of the N-channel MOS transistors 60 and 62 to compensate for the decrease in drive current caused by the resistor 64.

Although it may be possible to use a series of diodes in place of the thick field device, a thick field device is has more stable temperature characteristics. A series of diodes would require sufficient number that they would not turn on during normal operating conditions. However, diode turn-on voltage is temperature dependant. A characteristic diode of this type is shown in FIG. 6B. A first trace 91 plots current against forward voltage at 90 degrees C, while a second trace 93 plots current against forward voltage at 25 degrees C. At 90 degrees C, the diode conducts 1 micro-amp (1E-6) at about 0.30 volts. At 25 degrees C, the diode conducts several orders of magnitude less current at 0.3 volts, and conducts 1 micro-amp at about 0.48 volts. This undesirable temperature sensitivity is compounded when multiple diodes are connected in series.

Figure 8A:
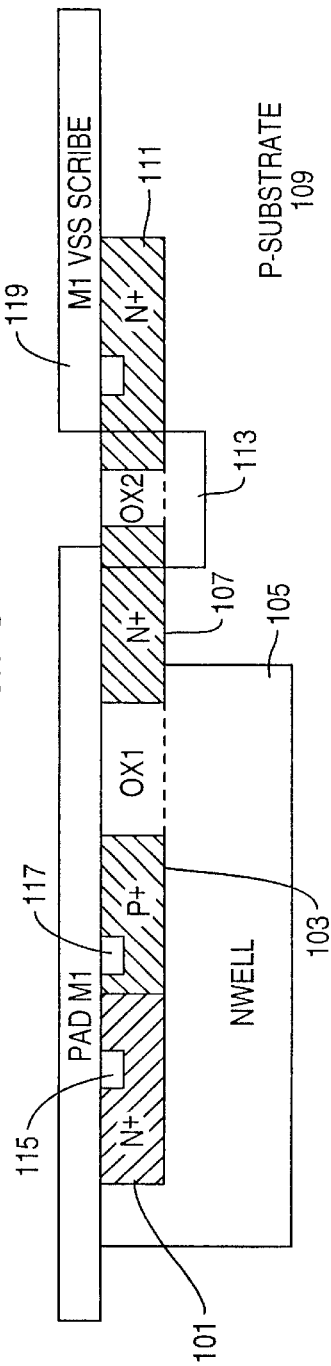
FIGS. 8A and 8B are side and top views, respectively, of an SCR as shown in FIG. 1.

FIG. 8a illustrates a cross-sectional view of a suitable SCR. A more complete description of fabrication and operation of such a device can be found in co-pending U.S. patent application Ser. No. 08/129,224, entitled "Field Implant for Silicon Controlled Rectifier" which is incorporated here by reference.

The SCR of FIG. 8a is formed from four semiconductor regions: P+ region 103, N-well 105 (in combination with N+ region 107), P-substrate 109, and N+ region 111. Regions OX1 and OX2 are regions that would be formed into field oxide. Region 113 reflects a region receiving an SCR dopant implant which can be controlled to adjust the characteristics of the SCR. An SCR without such a field implant would be expected to have trigger properties similar to other thick field devices on the substrate. As the field implant dose increases (and the dopant concentration in region 113 increases), the following happens:

1) the breakdown voltage at the junction between the N well and the P substrate decreases, which in turn decreases the latch-up trigger voltage;
2) the gain of the NPN transistor (formed by regions 111, 109 and 105) decreases, which in turn increases latch-up trigger current; and
3) holding voltage and holding current increases due to the increased NPN gain.

An improved SCR characteristic can be achieved with a field implant dose above 3E13/cm2, better above 10E13/cm2, best at about 2E14/cm2. The SCR field implant region 113 differs from a traditional field implant in that the SCR field implant has a higher concentration and is formed in a device specifically. created to operate as an SCR.

N+ region 101 provides a contact point 115 to the N-well 103, while N+ region 119 provides a contact point for the P-substrate 109. The N-well is biased relative to the P-substrate by connecting the N-well to pad M1 (a voltage source), while connecting the P-substrate to VSS.

P+ region 103 includes a contact point 117, which serves as the triggering input to the SCR.

Figure 8B:
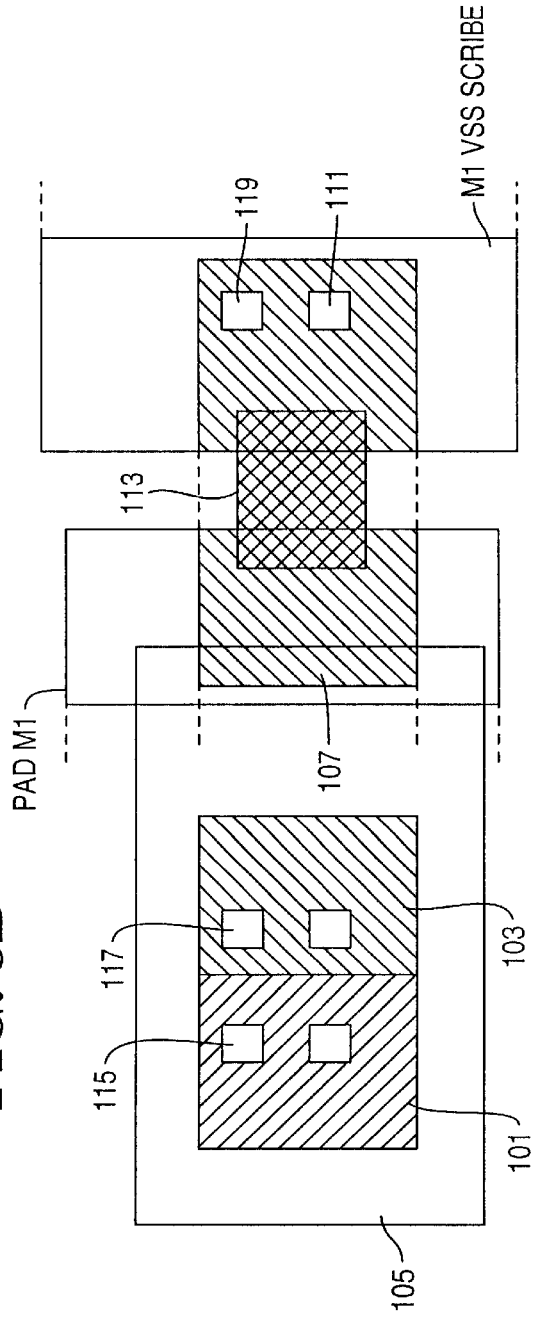

FIG. 8B illustrate a top view of the SCR illustrated in FIG. 8A. Corresponding structures are shown with the same reference numerals. For clarity, the metal layers (PAD M1 and M1 VSS SCRIBE) have been truncated, but should be understood to extend laterally commensurate with FIG. 8A.

Figure 9:
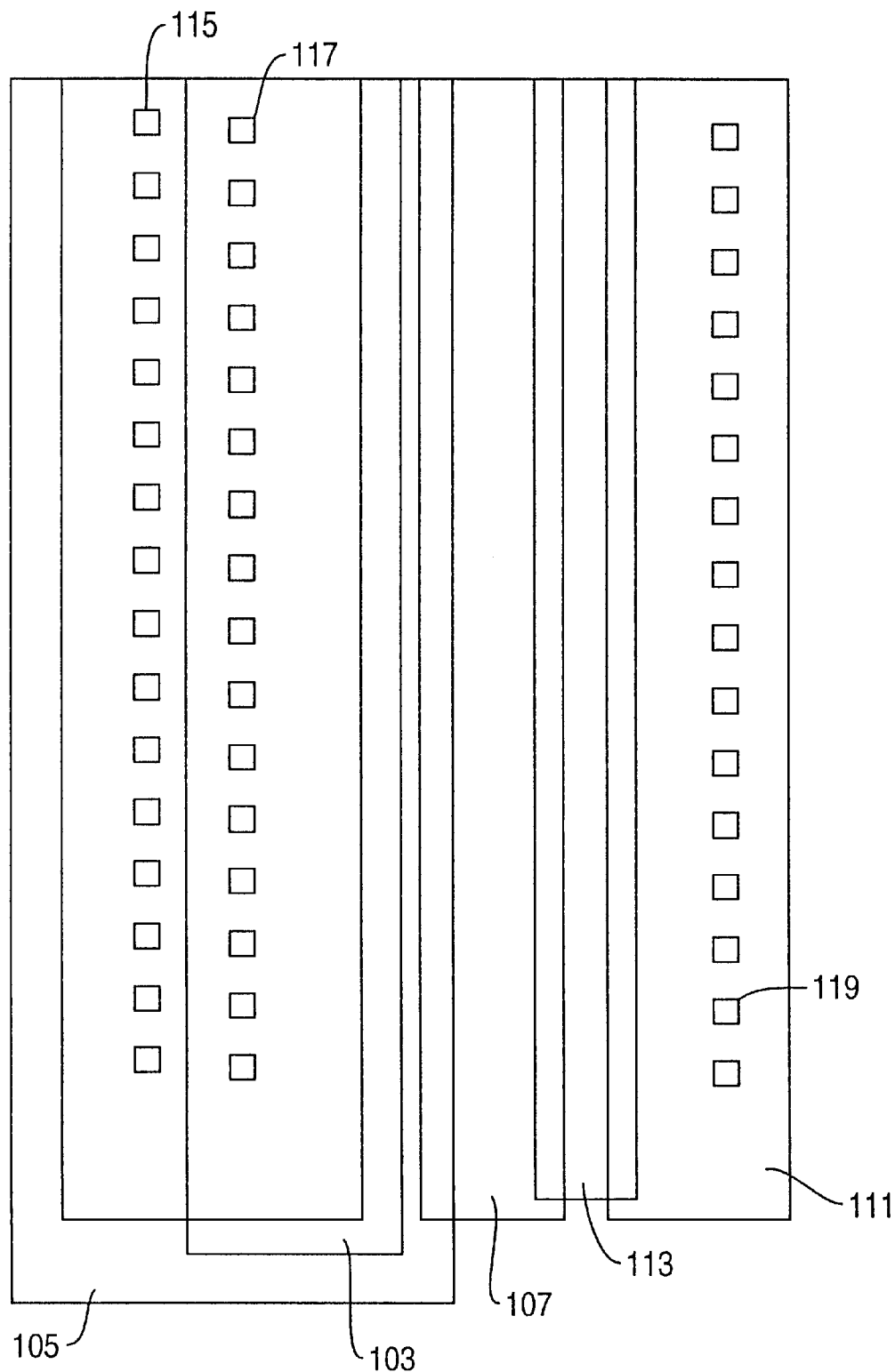
FIG. 9 is a top view of a portion of the SCR of FIGS. 8A and 8B.

The structure illustration of FIG. 8B has also been truncated vertically. As shown in FIG. 2, the SCR 32 extends the entire width of an IO pad 26. FIG. 9 shows a preferred SCR layout. FIGS. 8A, 8B and 9 use identical numerals for corresponding structures. As illustrated, the N well 105, P+ region 103, N+ regions 107 and 111, and field implant 133 extend in parallel for the width of an IO pad.

Figure 13:
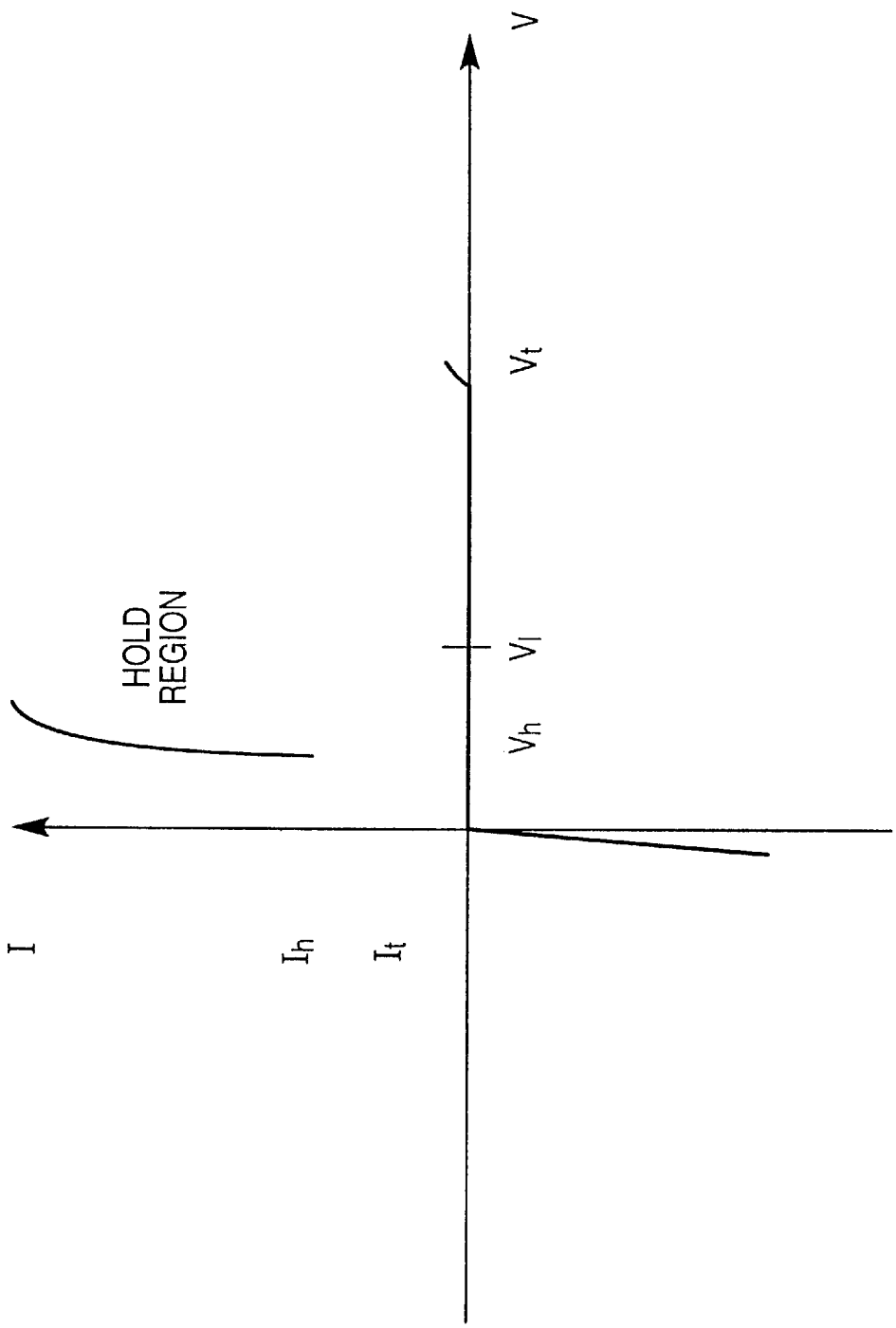
FIG. 13 is a graph showing performance characteristics of the SCR and thick field devices.

FIG. 13 illustrates a current-voltage relationship for the SCR. During normal operation (non-ESD), the voltage of the IO pad may switch between zero volts and a logic level VL. During a positive ESD event from IOPAD 26 to VSSIO pad 22, the voltage increases up to a threshold Vt, at which voltage the SCR turns on and conducts current. As current increases, the voltage decreases and the SCR enters the holding region. Preferably, Vt is at about 11.5V, and the holding voltage is about 2V. In this way, the SCR dissipates most of the ESD current to ground, and prevents the voltage from exceeding the breakdown voltage of other devices connected to the IO pad.

Thick field device 80 is a semiconducting element as described in co-pending United States patent application Ser. No. 08/259,239 entitled "Thick Field MOS Device for ESD Protection", filed concurrently herewith and incorporated herein by reference. A brief description will be included here.

Figure 10:
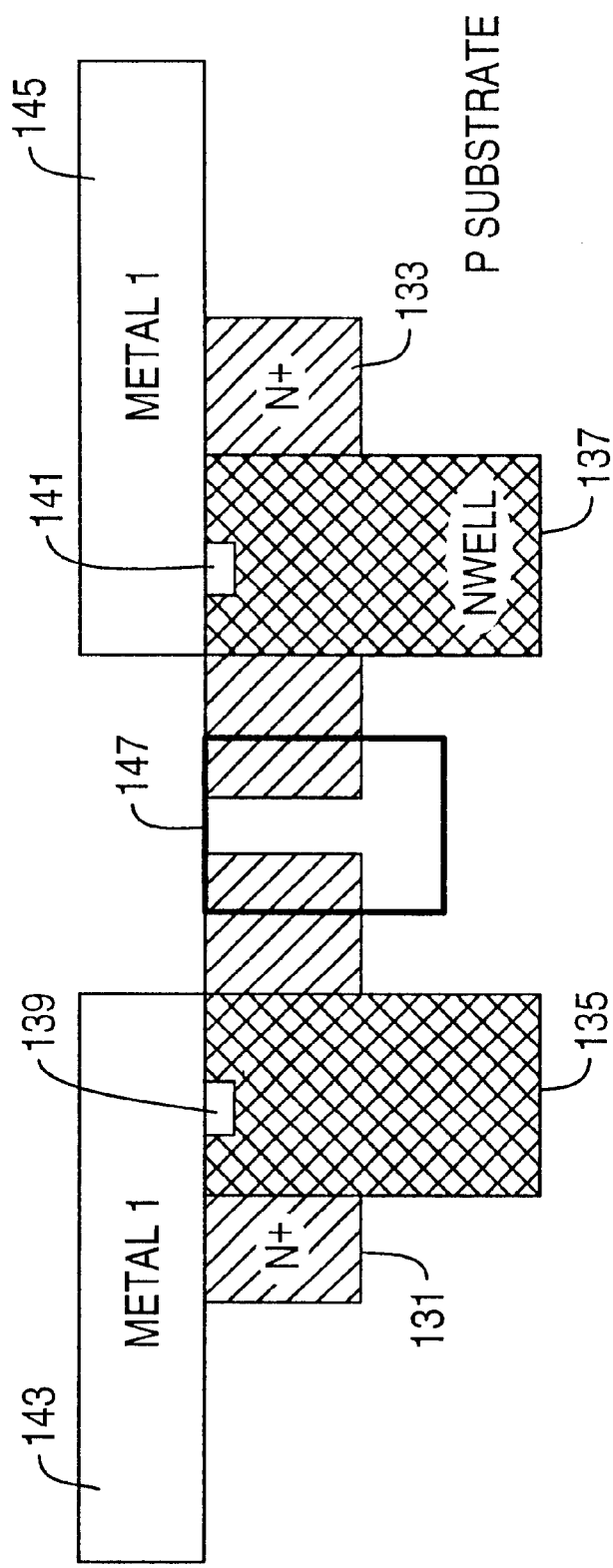
FIG. 10 is a side view of a thick field device as shown in FIG. 1.

FIG. 10 shows a cross section of a thick field device for use in the protection system of FIG. 1. Two N+ diffusion zones 131, 133 are located in a P substrate. The diffusion zones and the intervening P substrate form an NPN thick field device. Each N diffusion zone 131, 133 has contact points 139, 141 to respective metal conduction parts 143, 145.

Trigger properties of the thick field device may be adjusted by a heavy implant of P-type dopant in a region 147 between the N+ diffusion zones. For example, an implant of 1.7E14/cm2 boron at 40 KEV lowers the mean thick field breakdown voltage from about 14.5 volts without implant (14.57v), to about 10.0 volts (9.98v). This is particularly appropriate when the gate oxide breakdown voltage for MOS devices to be protected is about 14v.

Further, relatively deep wells of N-type dopant 135, 137 may be included under each of the N-well contacts 139. A 2 $\mu$m deep well is contemplated when the N+ diffusion zone is 0.25 $\mu$m deep. During ESD pulses, the metal/silicon contact area can be expected to heat and silicon from the N+ diffusion zones may migrate into the metal to create a junction spike. The N wells ensure that any such junction spike will not penetrate to the P substrate.

Figure 11:
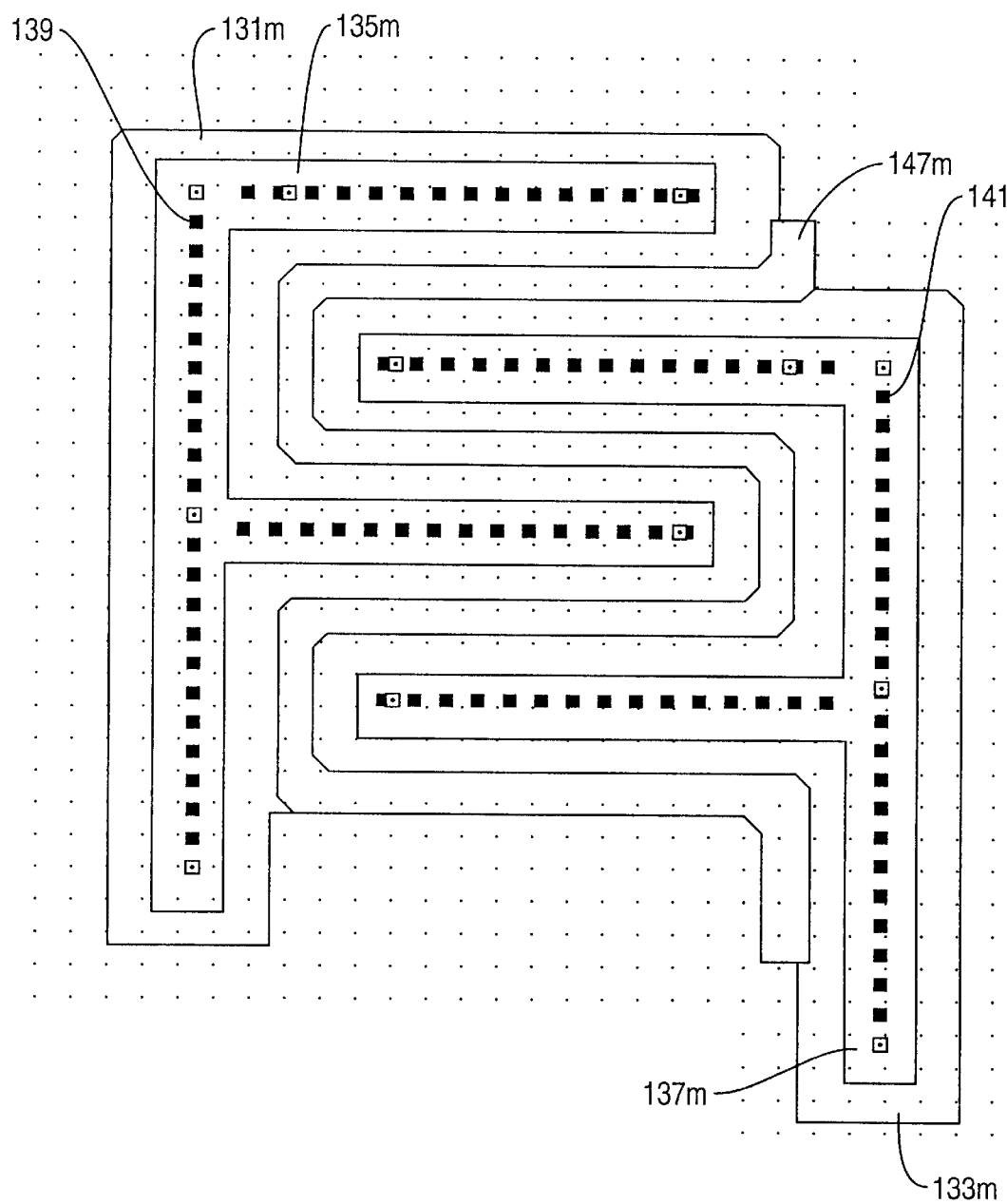
FIG. 11 is a top view of the thick field device of FIG. 10.

FIG. 11 shows a mask-layer view of an interdigitated thick field device. Mask patterns are labeled with the same numeral as the corresponding elements from FIG. 10, followed by the letter "m." Masks for first and second N diffusion zones 131m, 133m form interdigitated patterns. A mask for the heavy P implant 147m forms a serpentine pattern through the interdigitated N-diffusion zones. Each of the two N-diffusion zones 131m, 133m, has an additional, N-well mask 135m, 137m. The N-wells underlie the contact locations 139, 141. The metal layers use the same mask pattern in this region as the N-wells.

Figure 12:
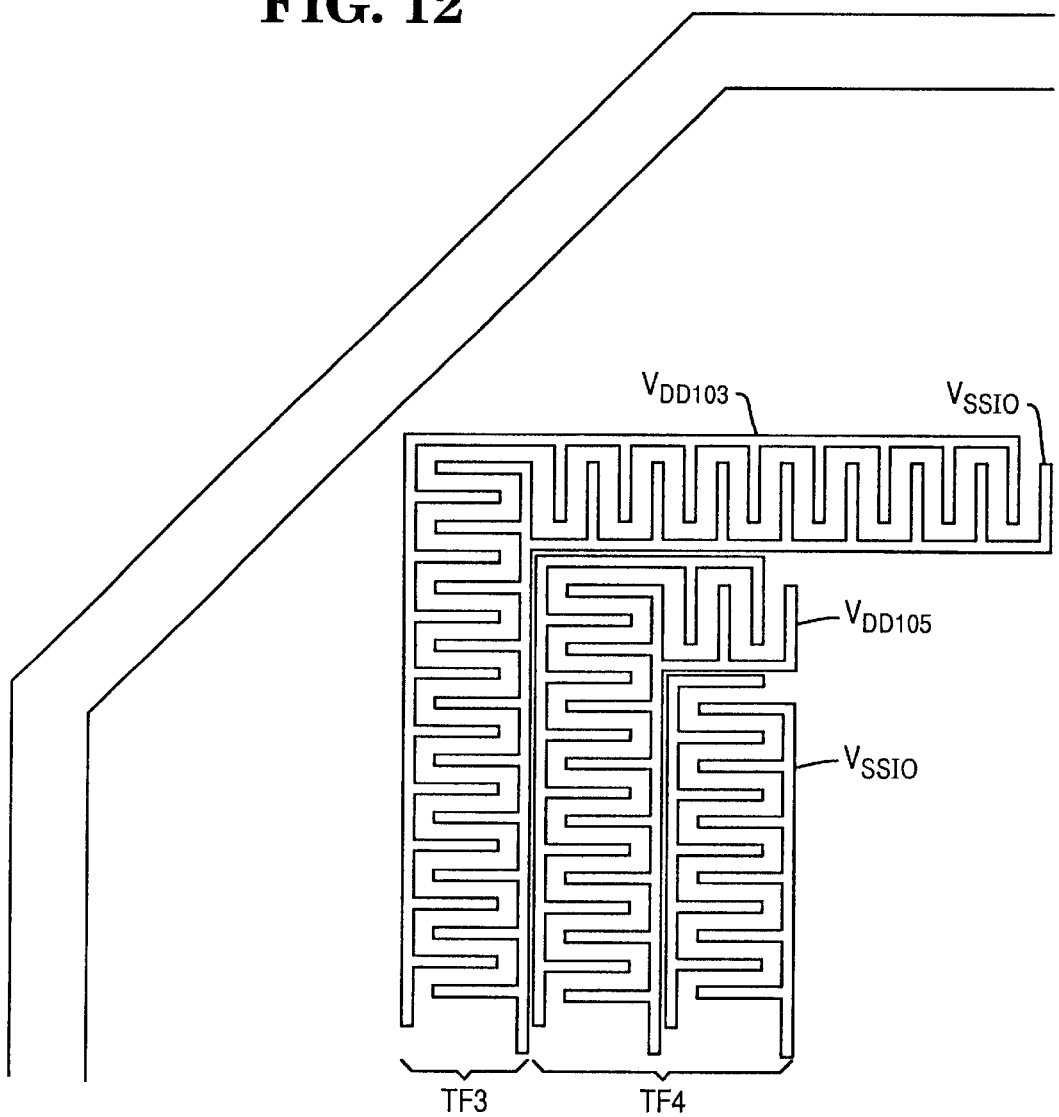
FIG. 12 is a top view for two of the thick field devices shown in FIG. 1.

FIG. 12 shows a layout for two thick field devices TF3–TF4, which have L-shaped layouts. Both are located in a corner of the integrated circuit. The L-shaped layout and the common, corner location provide layout flexibility.

Figure 6A:
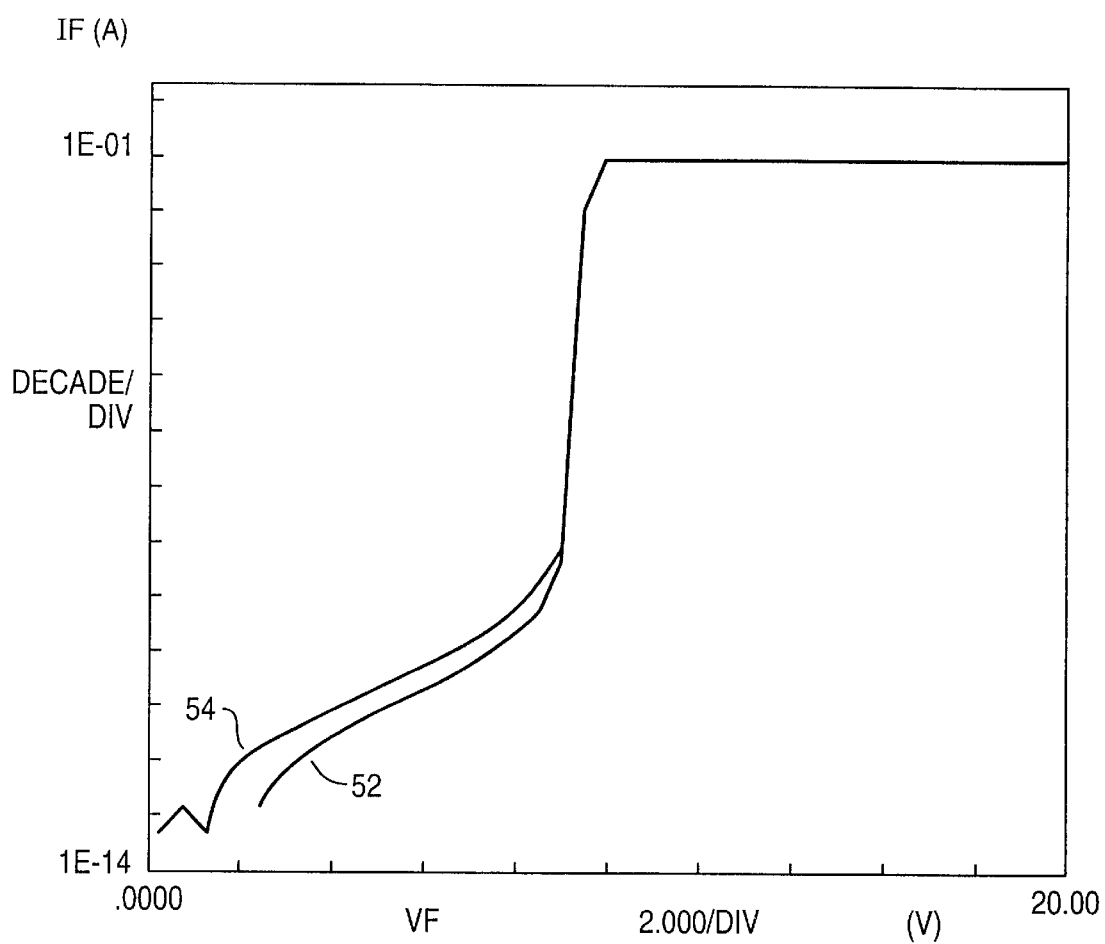
FIG. 6A is a graph showing performance of a thick field device for a first and tenth high-stress test event.
Figure 6B:
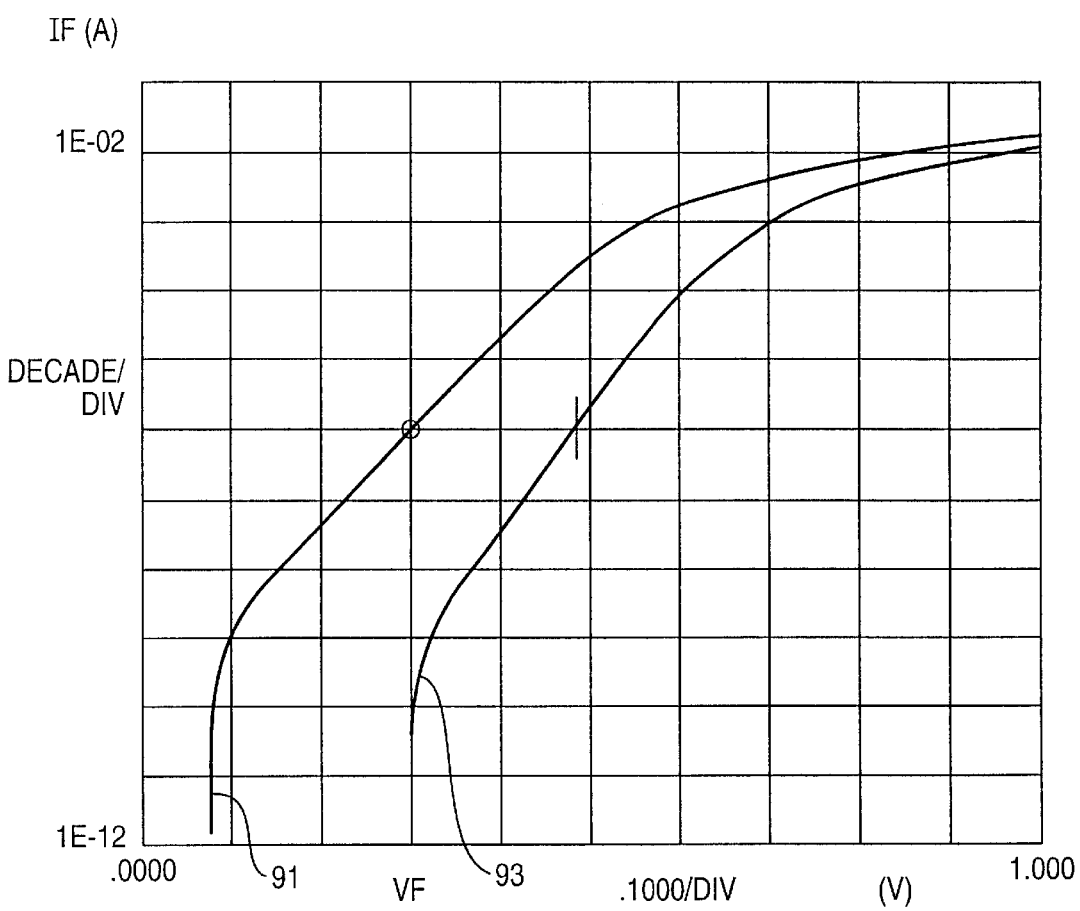
FIGS. 6B is a graph Showing the performance of the shunt diodes of FIGS. 5A and 5B under different temperature test conditions.

A characteristic graph of a representative thick field device of these types is shown in FIG. 6A. In this graph, trace 52 shows the operation of a device during conduction of a first high-stress event meant to test current carrying capacity during an ESD event. Trace 54 shows the operation of the device during a tenth high-stress event. In each stress event, current was measured as input voltage was swept from zero to twenty volts. As can be seen from FIG. 6A, a 40 $\mu$m wide thick field device can safely handle a 100 mA current.

In an integrated circuit, the thick field devices may be partially laid out at each corner of the semiconductor chip using a 1 mm fabrication width; thus, its total width is 4 mm. Since a 40 $\mu$m wide thick field device can safely handle a 100 mA current, scaling indicates that a 4 mm wide device theoretically should be able to handle 10 A without damage. The interdigitated pattern allows an increased interface between the N diffusion zones (when compared with a linear, non-interdigitated pattern). The increased interface, in turn provides increased current-carrying capacity per unit surface area of the integrated circuit.

In addition to a thick field device 80 providing an ESD conduction path from the VSSIO pad 22 to the VDDCORE3 pad 10, other thick field devices connect the VSSIO pad 22 to respective $V_{DD}$ pads. For example, thick field device 82 establishes an ESD path from the VDDCORE5 pad 12; thick field device 84 establishes an ESD path from the VDDI03 pad 14; thick field device 86 establishes an ESD path from the VDDI05 pad 16; and thick field device 88 establishes an ESD path from the VDDA pad 18 to the VSSIO pad 22. In this manner, when an ESD event occurs between IOPAD 26 and one of the $V_{DD}$ pads, the SCR 32 will turn on and conduct to VSSIO pad 22, and a respective one or several of the thick field devices 80, 82, 84, 86 and 88 will conduct thus completing a current path between the VSSIO pad 22 and any one of the VDD pads.

Additionally, two thick field devices 90 and 92 are placed between the $V_{DD}$ core pads 10 and 12 and between the $V_{DD}$ I/O pads 14 and 16, respectively. Thick field device 90 between VDDCORE3 pad 10 and VDDCORE5 pad 12 turns on when an ESD event occurs between either of those pads and IOPAD 26. It acts to equalize the current density between the pads when one of them receives an ESD pulse. This consequently activates each of thick field devices 80 and 82. Thick field device 92 provides a similar function for VDD103 and VDD105 pads. For example, as can be seen by inspection from FIG. 1, when an ESD even occurs between VDDCORE3 and VSSIO, TF5 will turn on due to the potential across the path VDDCORE 3-TF5-CDDCORE5-TF2-VSSIO. Current between VDDCORE3 and VSSIO will be distributed through both TF1 and TF2

Although a few preferred embodiments of the invention have been shown and described, it will be appreciated by those skilled in the art that changes may be made in these embodiments without departing from the principles and the spirit of the invention, the scope of which is defined in the appended claims.

What is claimed is:

1. An integrated circuit having over-voltage protection, the integrated circuit comprising:
   a first voltage source capable of providing a first voltage of a first voltage magnitude relative to a voltage reference during operation of said integrated circuit;
   a second voltage source capable of providing a second voltage of a second voltage magnitude relative to said voltage reference during operation of said integrated circuit, said second voltage magnitude being different from said first voltage magnitude;
   a plurality of terminals, said plurality of terminals comprising at least one IO pad; and
   a plurality of protection devices coupled with the plurality of terminals, said plurality of protection devices comprising:
      at least one parasitic diode formed by a metal oxide semiconductor transistor; and
      at least one silicon controlled rectifier;
   wherein the at least one parasitic diode and the at least one silicon controlled rectifier are electrically coupled in parallel between said IO pad and another of said plurality of terminals, and wherein at least a first one of the terminals receives the first voltage and at least a second one of the terminals receives the second voltage during operation of said integrated circuit.

2. The integrated circuit of claim 1, wherein the plurality of terminals further comprises a VDD voltage terminal and a ground voltage terminal, the VDD and the IO pad receiving different voltages relative to the ground voltage, and wherein at least one of the plurality of protection devices is connected between the VDD voltage terminal and the ground voltage terminal.

3. The integrated circuit of claim 1, wherein at least one of the plurality of protection devices is connected between terminals operating at different voltages.

4. The integrated circuit of claim 1, wherein one of the plurality of protection devices comprises first and second groups of series-connected diodes electrically connected between first and second ground voltage terminals of the plurality of terminals.

5. The integrated circuit of claim 1 wherein said integrated circuit is an application specific integrated circuit.

6. The integrated circuit of claim 1, wherein the first voltage magnitude is approximately 5 volts and the second voltage magnitude is approximately 3.3 volts.

7. A method for protecting an integrated circuit from overvoltages, said method comprising:

providing a first voltage source capable of providing a first voltage of a first voltage magnitude relative to a voltage reference during operation of said integrated circuit;

providing a second voltage source capable of providing a second voltage of a second voltage magnitude relative to said voltage reference during operation of said integrated circuit, said second voltage magnitude being different from said first voltage magnitude;

providing a plurality of terminals in said integrated circuit;

providing one of said plurality of terminals in said integrated circuit as an IO pad;

providing a plurality of protection devices coupled with the plurality of terminals;

providing as a first one of said plurality of protection devices a parasitic diode comprising a metal oxide semiconductor transistor;

providing as a second one of said plurality of protection devices a silicon controlled rectifier electrically coupled in parallel with said parasitic diode between said IO pad and another of said plurality of terminals; and providing the first voltage to at least a first one of the terminals and the second voltage to at least a second one of the terminals during operation of said integrated circuit.

8. An integrated circuit having over-voltage protection, the integrated circuit comprising:

a plurality of terminals, said plurality of terminals comprising at least one IO pad; and a plurality of protection devices coupled with the plurality of terminals, said plurality of protection devices comprising:

at least one parasitic diode formed by a metal oxide semiconductor transistor; and at least one silicon controlled rectifier;

wherein the at least one parasitic diode and the at least one silicon controlled rectifier are electrically coupled in parallel between said IO pad and another of said plurality of terminals and wherein at least a first one of the terminals receives approximately 5 volts relative to a voltage reference during operation of said integrated circuit and at least a second one of the terminals receives approximately 3.3 volts relative to the voltage reference during operation of said integrated circuit.

* * * * *